United States Patent [19]

Vascak et al.

[11] Patent Number: 5,230,462

[45] Date of Patent: Jul. 27, 1993

[54] METHOD OF SOLDERING A SPUTTERING TARGET TO A BACKING MEMBER

[75] Inventors: Milan Vascak, Valley Cottage; Anthony Sica, Mt. Vernon; Purnesh Seegopaul, Newburg, all of N.Y.

[73] Assignee: Materials Research Corporation, Orangeburg, N.Y.

[21] Appl. No.: 910,644

[22] Filed: Jul. 8, 1992

[51] Int. Cl.$^5$ .............................................. B23K 1/08
[52] U.S. Cl. ...................................... 228/222; 228/256
[58] Field of Search ................ 228/222, 121, 122, 256

[56] References Cited

U.S. PATENT DOCUMENTS

| | | | |
|---|---|---|---|
| 1,158,044 | 10/1915 | Graham | 228/223 X |
| 2,169,354 | 8/1939 | Chace | 328/215 X |
| 2,756,361 | 7/1956 | Germeshausen | 228/124 |
| 3,710,069 | 1/1973 | Papadopoulos et al. | 228/180.1 |
| 3,760,481 | 9/1973 | Greever | 228/36 |
| 3,879,837 | 4/1975 | Mizukoshi et al. | 228/123 |
| 4,019,671 | 4/1977 | Akyuerek | 228/123 |
| 4,200,782 | 4/1980 | Kuzmak et al. | 228/222 |
| 4,286,743 | 9/1981 | Vasseur et al. | 228/124 |
| 4,290,876 | 8/1981 | Nishiyama et al. | 204/298.13 |
| 4,332,342 | 6/1982 | van Der Put | 228/180.2 |
| 4,448,652 | 5/1984 | Pachonik | 204/298.12 |
| 4,540,115 | 9/1985 | Hawrylo | 228/222 |
| 4,544,091 | 10/1985 | Hidler | 228/124 |
| 4,569,745 | 2/1986 | Nagashima | 204/298.12 |
| 4,895,294 | 1/1990 | Thore | 228/222 |
| 4,927,069 | 5/1990 | Ushikubo et al. | 228/123 |
| 4,964,969 | 10/1990 | Kusakabe et al. | 204/298.13 |

FOREIGN PATENT DOCUMENTS

| | | | |
|---|---|---|---|
| 239808 | 10/1986 | German Democratic Rep. | 204/298.09 |
| 0093871 | 6/1983 | Japan | 204/298.09 |

Primary Examiner—Kenneth J. Ramsey
Attorney, Agent, or Firm—Wood, Herron & Evans

[57] ABSTRACT

A method of bonding a sputtering target to a backing member or plate for subsequent use in a sputtering operation. A target and a backing plate are first provided and one face of each of the target and backing plate are wetted with solder. The target and backing plate are then submerged in a solder bath, and the wetted faces of the target and backing plate are pressed into contact. The target and backing plate are then removed from the solder bath and while maintaining them pressed together, the solder interface therebetween is cooled directionally by causing cooling to occur from the center of the solder interface radially outwardly toward the periphery. The lowermost of the target and backing plate is provided with a circumferential lip adjacent the periphery of the solder interface. When the target and backing plate are removed from the solder bath the lip acts as a solder collector and provides a solder reservoir for supplying the periphery of the solder interface with solder as the solder interface is cooled.

24 Claims, 1 Drawing Sheet

U.S. Patent  July 27, 1993  5,230,462
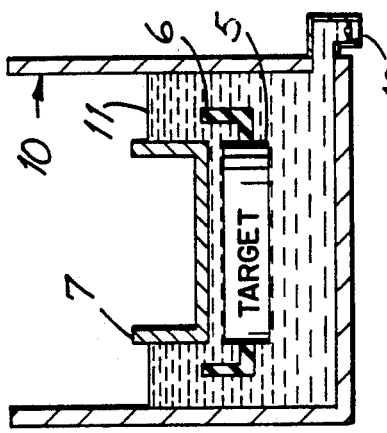
FIG. 3
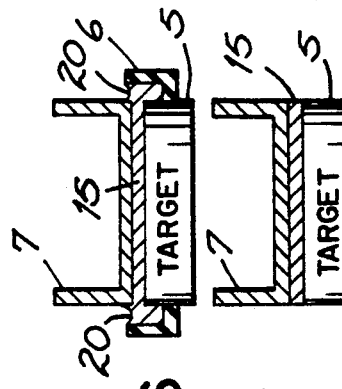
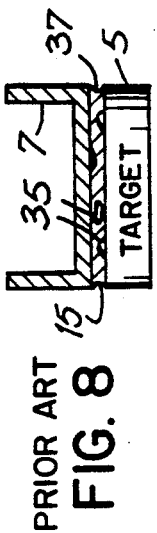
FIG. 6
FIG. 7
PRIOR ART FIG. 8
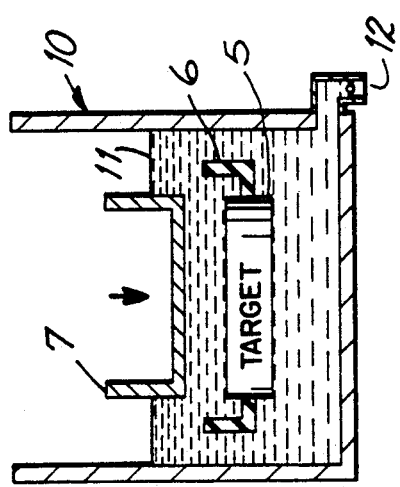
FIG. 2
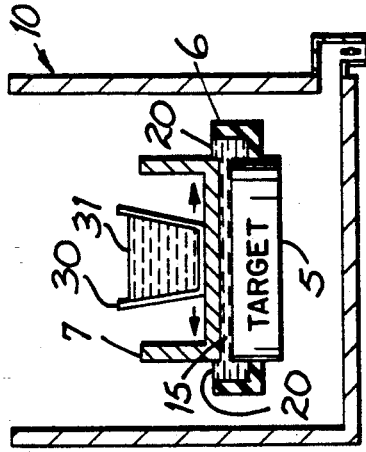
FIG. 5
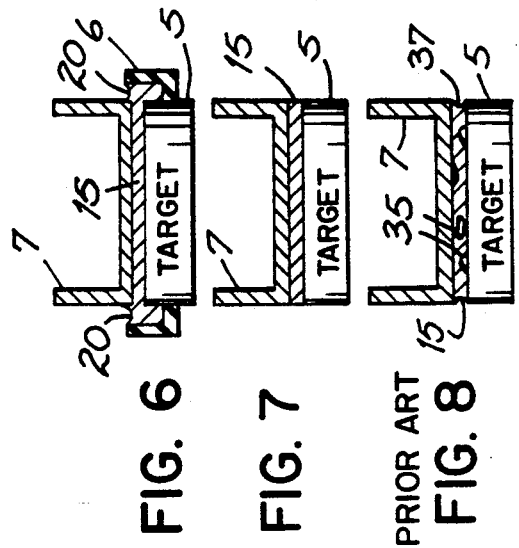
FIG. 1
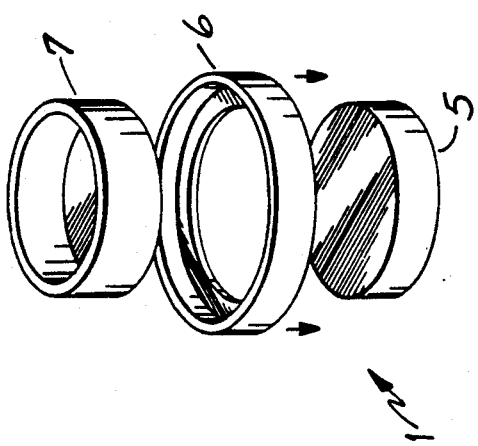
FIG. 4

METHOD OF SOLDERING A SPUTTERING TARGET TO A BACKING MEMBER

FIELD OF THE INVENTION

This invention relates to soldering/bonding, and more particularly to a method of soldering/bonding a sputtering target to a backing member or plate for subsequent use in a sputtering operation.

BACKGROUND OF THE INVENTION

In the production of semiconductors, it is common to attach or secure a sputtering target to a backing member or plate in order to perform a subsequent sputtering operation. The backing plate to which the sputtering target is secured serves as simply a mount or fixture with which to hold the sputtering target during the sputtering operation. It is important to effect a secure bond between the sputtering target and the backing plate because of thermal and mechanical stresses generated during the sputtering operation which create a tendency for the target to delaminate or separate from the backing plate. This undesirable tendency is amplified or accentuated if there are voids or other structural defects or imperfections in the material which is used to bond the sputtering target to the backing plate.

Typically, a target is secured to the backing plate by soldering/bonding. However, the solder bond between the target and backing plate has often proved to be unacceptable from a structural integrity standpoint. Specifically, air pockets or air bubbles, commonly known as "voids", can occur in the solder bond between the target and the backing plate. Since voids decrease the amount of solder available to transmit forces between the target and the backing plate, stresses in the solder increase, sometimes exceeding the ultimate strength of the solder, resulting in target delamination or separation from the backing plate during the sputtering operation.

Another drawback of conventional soldering techniques, wherein a sputtering target is soldered to a backing plate, is the creation of a gap or recess in the solder bond at the peripheral edge of the interface between the target and the backing plate. This gap or recess occurs due to the fact that as the solder between the target and backing plate is cooled, it tends to shrink, causing the solder to recede or move toward the center of the target, leaving a gap or recess around the edge of the solder interface. This gap or recess further reduces the integrity of the bond between the target and backing plate.

A further drawback of conventional soldering methods is the entrapment of surface oxides in the solder layers that can lead to delamination and failure between backing plate and target.

It has therefore been an objective of the present invention to provide a method for soldering/bonding a target to a backing plate which eliminates, or at least reduces, the voids and surface oxides located or trapped in the solder bond.

It has been another objective of the present invention to provide a method of soldering a target to a backing plate which eliminates, or reduces, the gap which occurs at the peripheral edge of the solder interface between the sputtering target and backing plate.

SUMMARY OF THE INVENTION

In accordance with the objectives of the present invention, a method of soldering a sputtering target to a backing plate is provided which includes the steps of wetting with solder the confronting sides of the sputtering target and backing plate which are to be joined, submerging the backing plate and target in a solder bath in superimposed relationship, and thereafter pressing the wetted sides of the sputtering target and backing plate into contact. The sputtering target and backing plate are then removed from the solder bath while maintaining them in contact, whereupon the solder interface is cooled directionally by causing cooling to occur from a centermost location of the sputtering target and backing plate radially outwardly, thereby minimizing or eliminating voids in the interior of the solder bond.

The sputtering target and backing plate can be removed from the solder bath by either draining the solder bath, or should automated manufacturing techniques be employed, such as robotics, the sputtering target and backing plate can simply be lifted out of the solder bath.

Alternatively, directional cooling is first initiated and the sputtering target and backing plate are thereafter removed from the solder bath.

In order to accomplish the directional cooling, a cooling mechanism comprising a container is placed in heat transfer contact with the central region of the sputtering target or the backing plate. In a preferred embodiment, the container is placed in heat transfer contact with the backing plate. Heat transfer fluid is then added to the container to remove heat from the central region of the sputtering target or backing plate, as the case may be, and in turn from the central region of the solder bond. Removal of heat from the central region of the solder bond causes the solder bond to cool directionally from the center radially outwardly to the peripheral edge.

In further accord with the objectives of the present invention, another method of bonding a sputtering target to a backing plate for subsequent use in a sputtering operation is provided. The method includes the wetting, submerging, pressing, removal and directional cooling steps as outlined above, plus the further step of supplying solder to the target/backing plate solder interface at its periphery as the solder interface is directionally cooled. In order to supply solder to the peripheral interface during the cooling step, either the sputtering target or backing plate, whichever is lowermost, is provided with a solder resevoir around the periphery of the solder interface. By the use of fixtures such a reservoir of solder can be created which supplies the peripheral edge of the solder interface with a solder flow as the solder interface cools. After the cooling step has been completed the target assembly is removed from its fixture.

In a preferred form, the reservoir forming fixture is a circumferential lip attached to the target or backing plate, as the case may be, which retains a supply of solder as the target/plate assembly is removed from the bath for supplying the peripheral edge of the solder interface with solder as the solder interface cools. The reservoir-forming circumferential lip may be fabricated of temperature resistant rubber which tightly embraces the periphery of the lowermost of the target or backing plate, while in the solder bath and thereafter during the removal and cooling steps. Other materials may be employed as well, such as aluminum or stainless steel.

One advantage of the present invention attributable to the radially outwardly directed cooling step is that voids in the interior of the solder bond, which are characteristic in prior art bonding techniques, are eliminated or at least reduced.

Another advantage of the present invention, attributable to providing a solder reservoir at the solder interface periphery, is that the void or gap at the periphery of the solder interface between the target and backing plate is eliminated or at least reduced.

Yet another advantage is that the structural between the target and of the present invention integrity of the solder bond the backing plate is increased and failures due to delamination because of thermal or mechanical stress are minimized.

These and other objects and advantages of the present invention will become more readily apparent during the following detailed description taken in conjunction with the drawings herein, in which:

BRIEF DESCRIPTION OF THE DRAWINGS

FIG. 1 is an exploded view of a sputtering target, solder reservoir-forming fixture lip and backing plate according to the present invention;

FIG. 2 illustrates the step of submerging the sputtering target with attached solder reservoir-forming lip and backing plate in a solder bath;

FIG. 3 illustrates the submerged sputtering target with attached reservoir-forming lip and backing plate pressed into contact with one another;

FIG. 4 illustrates the sputtering target with attached reservoir-forming lip and backing plate with solder therebetween being maintained in contact as the solder bath is drained;

FIG. 5 illustrates the directional cooling step of the present invention;

FIG. 6 illustrates the sputtering target solder bonded to a backing plate with the reservoir-forming lip still attached, according to the present invention;

FIG. 7 illustrates a target solder bonded to a backing plate according to the present invention, with the circummferential reservoir-forming lip and excess solder removed; and FIG. 8 illustrates a target solder bonded to a backing plate according to the prior art techniques wherein the solder bond is characterized by undesirable voids in the solder interface and an undesirable circumferential gap in the bond at the periphery of the solder interface between the target and backing plate.

DESCRIPTION OF THE PREFERRED EMBODIMENT

Referring first to FIG. 1, there is illustrated an assembly I employed in the present invention. The assembly 1 includes a sputtering target in the form of a circular disc, a circumferential temperature resistant, reservoir-defining fixture or rubber lip 6, and a backing member or plate 7. For subsequent use in a sputtering operation, the target 5 is to be bonded to the backing plate 7, which backing plate serves as a tool or fixture for holding the target in order that sputtering may be performed on the target. The temperature resistant rubber lip 6 is preferably attached to the outer diameter of the target 5, and may be elastically fitted thereon or secured by other conventional means. Of course, while the target, backing plate and circumferential lip are illustrated as being circular, most any desired shape could be employed for the practice of the present invention. Consequently, the invention is not to be limited to any specific overall shape of the above-mentioned items. Further, other materials such as aluminum or stainless steel may be employed for the fixture or 5 lip 6, which would be mechanically fitted onto the target 5.

With reference to FIG. 2, there is illustrated a beginning step in the practice of the present invention. Illustrated is a solder container or pot 10 within which is a solder bath 11. A drain 12 is included as part of the pot 10 for draining solder bath 11 from the put 10. It will be noted that the fixture or circumferential lip 6 has been attached to the target 5, below what will subsequently become the target/backing plate interface. The upper surface or face of the target 5 is wetted with solder, as is the lower side or face of the backing plate 7. Both are then submerged in the solder bath 11 within the solder pot 10, with their wetted faces confronting each other.

Referring now to FIG. 3, there is illustrated the backing plate 7 pressed into contact with the target 5 such that a resulting layer of solder 15 resides at the interface therebetween.

Referring now to FIG. 4, the solder bath 11 is drained from the solder pot 10 by virtue of the drain 12. Of course, an equivalent step would be to merely remove the target 5 and backing plate 7 from the solder bath 11 as by lifting while maintaining the two in contact. Such an equivalent step could be utilized, for example, in the automated mass production of sputtering targets and backing plates, wherein computer controlled robotic assembly line manufacturing techniques are employed. In addition to the solder layer 15 residing between the target 5 and backing plate 7, there will be noted at the peripheral interface of the target and backing plate a solder reservoir 20 which is created by the fixture or circumferential lip 6 which effectively acts as a solder dam.

Referring now to FIG. 5, the directional cooling step is illustrated. A cooling mechanism comprising a conductive container 30 is placed into heat transfer contact with the backing plate 7. A heat transfer fluid 31 is then slowly added to the container 30 thereby removing heat directly from the backing plate and indirectly from the solder interface 15 and the target 5. In order to effectuate directional cooling of the solder interface 15, that is, cooling from the center of the solder interface 15 in a radially outwardly direction, a heat transfer container 30 is initially used having a diameter which is smaller than the diameter of the target. If desired, a plurality of increasingly larger diameter heat transfer containers may be successively employed to effect directional cooling. The directional cooling step causes the solder at the center of the interface 15 between the backing plate 7 and sputtering target 5 to solidify first, with the solidification occurring at increasingly larger radii as cooling occurs from the center radially outwardly.

Alternatively, the directional cooling step can be initiated prior to removing the backing plate 7 and sputtering target 5 from the solder cooling bath 11.

The above-described directional cooling of the solder in the interface 15 minimizes voids heretofore formed using prior known soldering methods. The solder reservoir 20 established by the fixture or circumferential lip 6 will supply solder to the solder layer in the interface 15 located between the sputtering target 5 and backing plate 7 during at least a portion of the cooling step, preferably during at least the terminal portion of the cooling step when the periphery of the solder interface is solidifying. Therefore, when cooling progresses to the periphery of the solder interface between the target and backing plate, there will be supplied thereat additional solder from the solder reservoir 20 such that no gap or void will be formed thereat as was typical with prior known soldering techniques.

Referring now to FIG. 6, there is illustrated a backing plate 7 with sputtering target 5 solder bonded thereto according to the present invention. It will be noted that the solder reservoir 20 has receded slightly within the fixture or circumferential lip 6 as solder was fed into the periphery of the solder layer 15 between the target 5 and backing plate 7 during the directional cooling step.

After the interface 15 has fully cooled, the circumferential lip or fixture 6 and then the excess solder from the solder reservoir 20 is removed, as is illustrated in FIG. 7. The resulting target 5 bonded to backing plate 7 via the solder layer 15 resulting from the method of the invention herein is substantially free of voids within the interior of the bond 15 and furthermore does not include a shrinkage-induced gap at the periphery of the interface between the target 5 and backing plate. This is in contrast to prior art soldered target/backing plate assemblies, shown in FIG. 8, which contain voids 35 and a peripheral gap or recess or groove 37.

Those skilled in the art will readily recognize numerous modifications and adaptations that can be made to the present invention which will result in an improved method of bonding a sputtering target to a backing plate, yet all of which will be within the spirit and scope of the present invention as defined in the following claims. Accordingly I intend to be limited only by the claims.

What is claimed is:

1. A method of bonding a sputtering target to a backing plate for subsequent use in a sputtering operation comprising the steps of:
   providing a sputtering target having a face;
   providing a backing member having a face;
   wetting said face of said sputtering target with solder thereby creating a wetted face thereon;
   wetting said face of said backing plate with solder thereby creating a wetted face thereon;
   submerging said sputtering target and backing plate in a solder bath;
   pressing said wetted faces of said sputtering target and backing plate against each other to define a solder interface therebetween;
   removing said sputtering target and backing plate from said solder bath while maintaining said wetted faces of said sputtering target and backing plate pressed against each other; and
   directionally cooling said solder interface between said sputtering target and backing plate in a radially outward direction by causing cooling to first occur from a center thereof and thereafter progressively radially outwardly therefrom.

2. The method of claim 1 wherein said sputtering target and backing plate are effectively removed from said solder bath by draining said solder bath.

3. The method of claim 1 wherein said sputtering target and backing plate are removed from said solder bath by lifting said sputtering target and backing plate out of said solder bath.

4. The method of claim 1 wherein said directional cooling of said solder interface between said sputtering target and backing plate is accomplished by initially placing a container in heat transfer contact only with a central region of one of said sputtering target and backing plate and adding heat transfer fluid to said container to thereby remove heat from said central region of said solder interface via said one of said sputtering target and backing plate which is in heat transfer contact with said container.

5. The method of claim 4 wherein said container is initially placed in heat transfer contact with said backing plate.

6. The method of claim 1 wherein said directional cooling is initiated before said sputtering target and backing plate are removed from said solder bath.

7. A method of bonding a sputtering target to a backing plate for subsequent use in a sputtering operation comprising the steps of:
   providing a sputtering target having a face;
   providing a backing member having a face;
   wetting said face of said sputtering target with solder thereby creating a wetted face thereon;
   wetting said face of said backing plate with solder thereby creating a wetted face thereon;
   submerging said sputtering target and backing plate in a solder bath;
   pressing said wetted faces of said sputtering target and backing plate against each other to define a solder interface therebetween;
   removing said sputtering target and backing plate from said solder bath while maintaining said wetted faces of said sputtering target and backing plate pressed against each other;
   directionally cooling said solder interface between said sputtering target and backing plate in a radially outward direction by causing cooling to first occur from a center thereof and thereafter progressively radially outwardly therefrom; and
   supplying solder to a periphery of said solder interface between said sputtering target and backing plate during at least a portion of said directional cooling step.

8. The method of claim 7 wherein said sputtering target and backing plate are effectively removed from said solder bath by draining said solder bath.

9. The method of claim 7 wherein said sputtering target and backing plate are removed from said solder bath by lifting said sputtering target and backing plate out of said solder bath.

10. The method of claim 7 wherein the lowermost one of said sputtering target and backing plate has a fixture thereon adjacent said periphery of said solder interface such that when said sputtering 5 target and backing plate are removed from said solder bath said fixture acts as a solder collector and provides a solder reservoir for supplying said solder interface periphery with solder as said solder interface is cooled.

11. The method of claim 10 wherein said fixture is a circumferential lip which is on said sputtering target.

12. The method of claim 10 wherein said circumferential lip is fabricated of temperature resistant elastic material and is maintained in position adjacent said solder interface by its elasticity.

13. The method of claim 10 wherein said circumferential lip is fabricated of a metal and is maintained in position adjacent said solder interface by mechanical means.

14. The method of claim 7 wherein said directional cooling of said solder interface between said sputtering target and backing plate is accomplished by initially placing a container in heat transfer contact only with a central region of one of said sputtering target and backing plate and adding heat transfer fluid to said container to thereby remove heat from said central region of said solder interface via said one of said sputtering target and backing plate which is in heat transfer contact with said container.

15. The method of claim 14 wherein said container is initially placed in heat transfer contact with said backing plate.

16. The method of claim 7 wherein said directional cooling is initiated before said sputtering target and backing plate are removed from said solder bath.

17. A method of bonding a sputtering target to a backing plate for subsequent use in a sputtering operation comprising the steps of:
providing a sputtering target having a face;
providing a backing member having a face;
wetting said face of said sputtering target with solder thereby creating a wetted face thereon;
wetting said face of said backing plate with solder thereby creating a wetted face thereon;
submerging said sputtering target and backing plate in a solder bath;
pressing said wetted faces of said sputtering target and backing plate against each other to define a solder interface therebetween;
removing said sputtering target and backing plate from said solder bath while maintaining said wetted faces of said sputtering target and backing plate pressed against each other;
cooling said solder interface between said sputtering target and backing plate; and
supplying solder to a periphery of said solder interface between said sputtering target and backing plate during at least a portion of said cooling step.

18. The method of claim 17 wherein said sputtering target and backing plate are effectively removed from said solder bath by draining said solder bath.

19. The method of claim 17 wherein said sputtering target and backing plate are removed from said solder bath by lifting said sputtering target and backing plate out of said solder bath.

20. The method of claim 17 wherein the lowermost one of said sputtering target and backing plate has a fixture thereon adjacent said periphery of said solder interface such that when said sputtering target and backing plate are removed from said solder bath said fixture acts as a solder collector and provides a solder reservoir for supplying said solder interface periphery with solder as said solder interface is cooled.

21. The method of claim 20 wherein said fixture is a circumferential lip which is on said sputtering target.

22. The method of claim 21 wherein said circumferential lip is fabricated of temperature resistant elastic material and is maintained in position adjacent said solder interface by its elasticity.

23. The method of claim 21 wherein said circumferential lip is fabricated of a metal and is maintained in position adjacent said solder interface by mechanical means.

24. The method of claim 17 wherein said cooling is initiated before said sputtering target and backing plate are removed from said solder bath.

* * * * *